US012592270B2

(12) United States Patent
Lee et al.

(10) Patent No.: US 12,592,270 B2
(45) Date of Patent: Mar. 31, 2026

(54) BANK-SHARED USAGE-BASED DISTURBANCE CIRCUITRY

(71) Applicant: Micron Technology, Inc., Boise, ID (US)

(72) Inventors: Yunyoung Lee, Meridian, ID (US); Yuan He, Boise, ID (US); Yang Lu, Boise, ID (US); Kang-Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 129 days.

(21) Appl. No.: 18/635,631

(22) Filed: Apr. 15, 2024

(65) Prior Publication Data

US 2024/0371426 A1      Nov. 7, 2024

Related U.S. Application Data

(60) Provisional application No. 63/500,508, filed on May 5, 2023.

(51) Int. Cl.
| | |
|---|---|
| *G11C 16/04* | (2006.01) |
| *G06F 3/06* | (2006.01) |
| *G11C 11/406* | (2006.01) |
| *G11C 11/4096* | (2006.01) |

(52) U.S. Cl.
CPC ............ *G11C 11/406* (2013.01); *G06F 3/061* (2013.01); *G06F 3/0659* (2013.01); *G06F 3/0673* (2013.01); *G11C 11/4096* (2013.01)

(58) Field of Classification Search
CPC .................................................... G11C 11/406
See application file for complete search history.

(56) References Cited

U.S. PATENT DOCUMENTS

| | | | | |
|---|---|---|---|---|
| 6,198,667 B1 * | 3/2001 | Joo | ........................... | G11C 8/12 |
| | | | | 714/763 |
| 6,473,356 B1 * | 10/2002 | Raszka | .................... | G11C 7/12 |
| | | | | 365/205 |
| 9,190,138 B2 * | 11/2015 | Song | ........................ | G11C 7/02 |

* cited by examiner

*Primary Examiner* — Pho M Luu
(74) *Attorney, Agent, or Firm* — Colby Nipper PLLC

(57) ABSTRACT

Apparatuses and methods for implementing bank-shared usage-based disturbance circuitry are described. Bank-shared usage-based disturbance circuitry is coupled to the at least two banks of a memory device and can mitigate usage-based disturbance within these banks. To detect a condition associated with usage-based disturbance, the bank-shared usage-based disturbance circuitry selectively reads data associated with usage-based disturbance from one of the at least two banks. To mitigate usage-based disturbance, the bank- shared usage-based disturbance circuitry can selectively cause one or more rows within either of the at least two banks to be refreshed. By using the same circuitry to mitigate usage-based disturbance across multiple banks, the total footprint, complexity, and power consumption of the memory device can be reduced relative to other memory devices that utilize circuitry that is dedicated for each bank. The memory device can therefore be integrated within space-constrained and power-constrained devices such as, for example, portable devices.

20 Claims, 7 Drawing Sheets

100

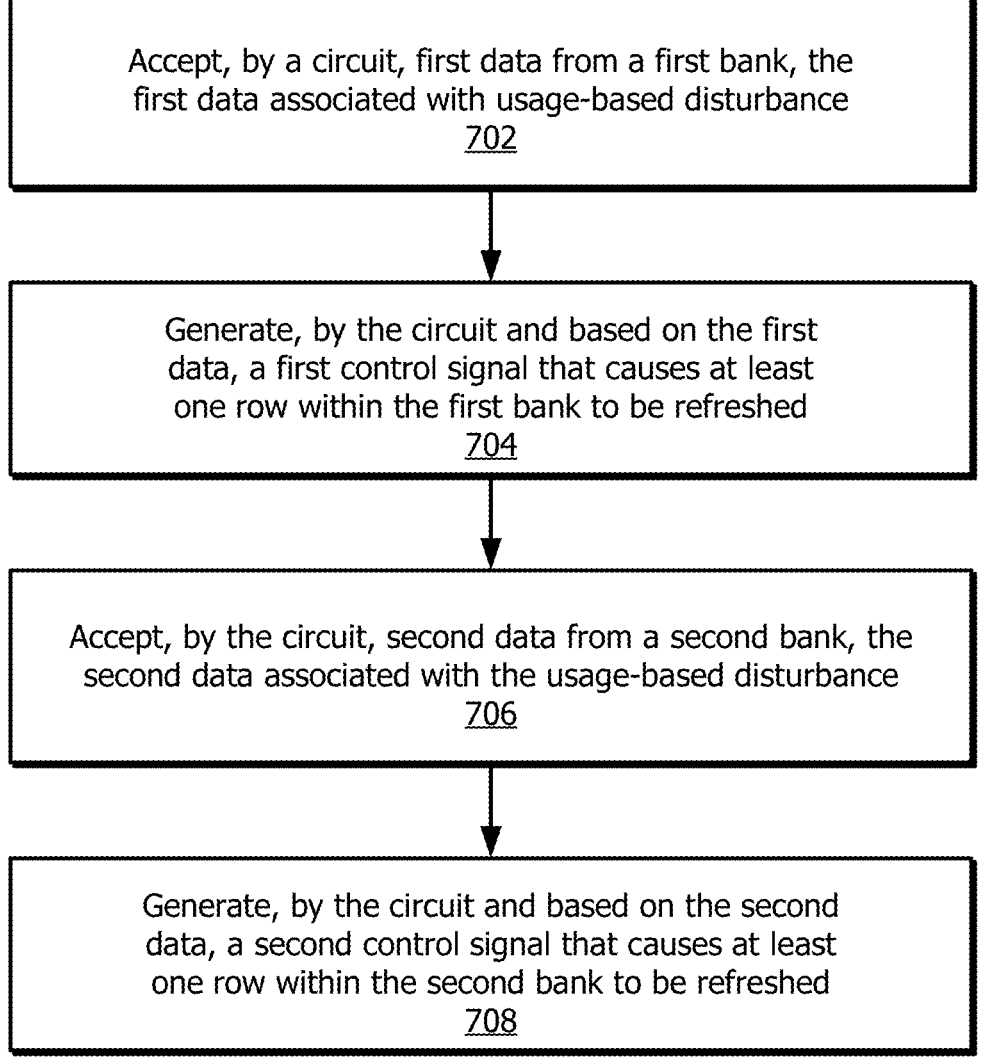

Accept, by a circuit, first data from a first bank, the
first data associated with usage-based disturbance
702

Generate, by the circuit and based on the first
data, a first control signal that causes at least
one row within the first bank to be refreshed
704

Accept, by the circuit, second data from a second bank, the
second data associated with the usage-based disturbance
706

Generate, by the circuit and based on the second
data, a second control signal that causes at least
one row within the second bank to be refreshed
708

FIG. 7

BANK-SHARED USAGE-BASED DISTURBANCE CIRCUITRY

CROSS-REFERENCE TO RELATED APPLICATION(S)

This application claims the benefit of U.S. Provisional Patent Application Ser. No. 63/500,508 filed on May 5, 2023, the disclosure of which is incorporated by reference herein in its entirety.

BACKGROUND

Computers, smartphones, and other electronic devices rely on processors and memories. A processor executes code based on data to run applications and provide features to a user. The processor obtains the code and the data from a memory. The memory in an electronic device can include volatile memory (e.g., random-access memory (RAM)) and non-volatile memory (e.g., flash memory). Like the capabilities of a processor, the capabilities of a memory can impact the performance of an electronic device. This performance impact can increase as processors are developed that execute code faster and as applications operate on increasingly larger data sets that require ever-larger memories.

BRIEF DESCRIPTION OF THE DRAWINGS

Apparatuses of and techniques for implementing bank-shared usage-based disturbance circuitry are described with reference to the following drawings. The same numbers are used throughout the drawings to reference like features and components:

FIG. 7 is an example method for implementing aspects of bank-shared usage-based disturbance circuitry.

DETAILED DESCRIPTION

Overview

Figure 1:
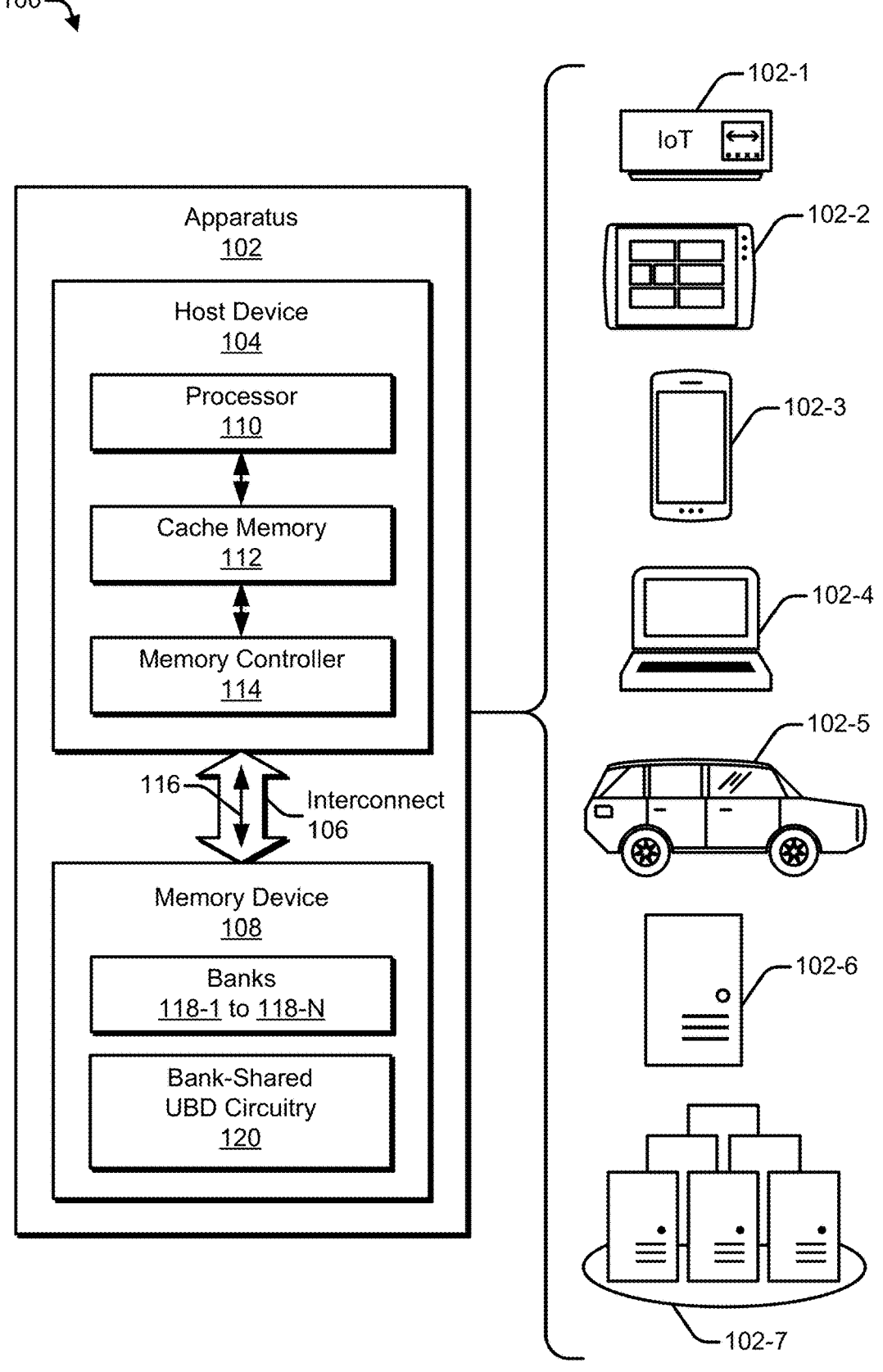
FIG. 1 illustrates an example operating environment that can implement aspects of bank-shared usage-based disturbance (UBD) circuitry.

Processors and memory work in tandem to provide features to users of computers and other electronic devices. As processors and memory operate more quickly together in a complementary manner, an electronic device can provide enhanced features, such as high-resolution graphics and artificial intelligence (AI) analysis. Some applications, such as those for financial services, medical devices, and advanced driver assistance systems (ADAS), can also demand more-reliable memories. These applications use increasingly reliable memories to limit errors in financial transactions, medical decisions, and object identification.

However, in some implementations, more-reliable memories can sacrifice bit densities, power efficiency, and simplicity.

To meet demands for physically smaller memories, memory devices can be designed with higher chip densities. Increasing chip density, however, can increase electromagnetic coupling (e.g., capacitive coupling) between adjacent or proximate rows of memory cells due, at least in part, to a shrinking distance between such rows. With this undesired coupling, activation (or charging) of a first row of memory cells can sometimes negatively impact a second nearby row of memory cells. In particular, activation of the first row can generate interference, or crosstalk, that causes the second row to experience a voltage fluctuation. In some instances, this voltage fluctuation can cause a state (or value) of a memory cell in the second row to be incorrectly determined by a sense amplifier. Consider an example in which a state of a memory cell in the second row is a "1". In this example, the voltage fluctuation can cause a sense amplifier to incorrectly determine the state of the memory cell to be a "0" instead of a "1". Left unchecked, this interference can lead to memory errors or data loss within the memory device.

In some circumstances, a particular row of memory cells is activated repeatedly in an unintentional or intentional (sometimes malicious) manner. Consider, for instance, that memory cells in an $R^{th}$ row are subjected to repeated activation, which causes one or more memory cells in an adjacent row (e.g., within an R+1 row, an R+2 row, an R−1 row, and/or an R−2 row) to change states. This effect is referred to as a usage-based disturbance. The occurrence of usage-based disturbance can lead to corruption or changing of contents within the affected row of memory.

Some memory devices utilize circuits that can detect usage-based disturbance and mitigate its effects. These circuits are typically incorporated in each memory bank or block of a memory device. However, with higher chip densities, the number of memory banks or blocks in a memory device also increases, thus increasing the number of circuits required to mitigate the effects of usage-based disturbance. Incorporating a separate circuit in each bank can add complexity and cost to a memory device. Also, increasing the number of these circuits in the memory device can increase an overall footprint and power consumption of the memory device, which can make it challenging to integrate the memory device within space-constrained devices, including portable devices.

To address this and other issues regarding usage-based disturbance, this document describes aspects of bank-shared usage-based disturbance (UBD) circuitry. Bank-shared usage-based disturbance circuitry is coupled to at least two banks of a memory device and can mitigate usage-based disturbance within these banks. To detect a condition associated with usage-based disturbance, the bank-shared usage-based disturbance circuitry selectively reads data associated with usage-based disturbance from one of the banks. To mitigate usage-based disturbance, the bank-shared usage-based disturbance circuitry can selectively cause one or more rows within either of the at least two banks to be refreshed. By using the same circuitry to mitigate usage-based disturbance across multiple banks, the total footprint and complexity of the bank-shared usage-based disturbance circuitry in the memory device can be reduced relative to other memory devices that utilize dedicated circuitry for each bank. Also, using the same circuitry for multiple banks reduces the power consumption of the memory device relative to other memory devices that utilize dedicated circuitry for each bank. Consequently, the memory device can be integrated within space-constrained and power-constrained devices such as, for example, portable devices.

Example Operating Environments

FIG. 1 illustrates, at 100 generally, an example operating environment including an apparatus 102 that can implement bank-shared usage-based disturbance circuitry. The apparatus 102 can include various types of electronic devices, including an internet-of-things (IoT) device 102-1, tablet device 102-2, smartphone 102-3, notebook computer 102-4, passenger vehicle 102-5, server computer 102-6, and server cluster 102-7 that may be part of cloud computing infrastructure, a data center, or a portion thereof (e.g., a printed circuit board (PCB)). Other examples of the apparatus 102 include a wearable device (e.g., a smartwatch or intelligent glasses), an entertainment device (e.g., a set-top box, video dongle, smart television, gaming device), a desktop computer, a motherboard, a server blade, a consumer appliance, a vehicle, a drone, industrial equipment, a security device, a sensor, or the electronic components thereof. Each type of apparatus can include one or more components to provide computing functionalities or features.

In example implementations, the apparatus 102 can include at least one host device 104, at least one interconnect 106, and at least one memory device 108. The host device 104 can include at least one processor 110, at least one cache memory 112, and a memory controller 114. The memory device 108, which can also be realized with a memory module, can include, for example, a dynamic random-access memory (DRAM) die or module (e.g., Low-Power Double Data Rate synchronous DRAM (LPDDR SDRAM)). The DRAM die or module can include a three-dimensional (3D) stacked DRAM device, which may be a high-bandwidth memory (HBM) device or a hybrid memory cube (HMC) device. The memory device 108 can operate as a main memory for the apparatus 102. Although not illustrated, the apparatus 102 can also include storage memory. The storage memory can include, for example, a storage-class memory device (e.g., a flash memory, hard disk drive, solid-state drive, phase-change memory (PCM), or memory employing 3D XPoint™).

The processor 110 is operatively coupled to the cache memory 112, which is operatively coupled to the memory controller 114. The processor 110 is also coupled, directly or indirectly, to the memory controller 114. The host device 104 may include other components to form, for instance, a system-on-a-chip (SoC). The processor 110 may include a general-purpose processor, central processing unit, graphics processing unit (GPU), neural network engine or accelerator, application-specific integrated circuit (ASIC), field-programmable gate array (FPGA) integrated circuit (IC), or communications processor (e.g., a modem or baseband processor).

In operation, the memory controller 114 can provide a high-level or logical interface between the processor 110 and at least one memory (e.g., an external memory). The memory controller 114 may be realized with any of a variety of suitable memory controllers (e.g., a double-data-rate (DDR) memory controller that can process requests for data stored on the memory device 108). Although not shown, the host device 104 may include a physical interface (PHY) that transfers data between the memory controller 114 and the memory device 108 through the interconnect 106. For example, the physical interface may be an interface that is compatible with a DDR PHY Interface (DFI) Group interface protocol. The memory controller 114 can, for example, receive memory requests from the processor 110 and provide the memory requests to external memory with appropriate formatting, timing, and reordering. The memory controller 114 can also forward to the processor 110 responses to the memory requests received from external memory.

The host device 104 is operatively coupled, via the interconnect 106, to the memory device 108. In some examples, the memory device 108 is connected to the host device 104 via the interconnect 106 with an intervening buffer or cache. The memory device 108 may operatively couple to storage memory (not shown). The host device 104 can also be coupled, directly or indirectly via the interconnect 106, to the memory device 108 and the storage memory. The interconnect 106 and other interconnects (not illustrated in FIG. 1) can transfer data between two or more components of the apparatus 102. Examples of the interconnect 106 include a bus (e.g., a unidirectional or bidirectional bus), switching fabric, or one or more wires that carry voltage or current signals. The interconnect 106 can propagate one or more communications 116 between the host device 104 and the memory device 108. For example, the host device 104 may transmit a memory request to the memory device 108 over the interconnect 106. Also, the memory device 108 may transmit a corresponding memory response to the host device 104 over the interconnect 106.

The illustrated components of the apparatus 102 represent an example architecture with a hierarchical memory system. A hierarchical memory system may include memories at different levels, with each level having memory with a different speed or capacity. As illustrated, the cache memory 112 logically couples the processor 110 to the memory device 108. In the illustrated implementation, the cache memory 112 is at a higher level than the memory device 108. A storage memory, in turn, can be at a lower level than the main memory (e.g., the memory device 108). Memory at lower hierarchical levels may have a decreased speed but increased capacity relative to memory at higher hierarchical levels.

The apparatus 102 can be implemented in various manners with more, fewer, or different components. For example, the host device 104 may include multiple cache memories (e.g., including multiple levels of cache memory) or no cache memory. In other implementations, the host device 104 may omit the processor 110 or the memory controller 114. A memory (e.g., the memory device 108) may have an "internal" or "local" cache memory. As another example, the apparatus 102 may include cache memory between the interconnect 106 and the memory device 108. Computer engineers can also include any of the illustrated components in distributed or shared memory systems.

Computer engineers may implement the host device 104 and the various memories in multiple manners. In some cases, the host device 104 and the memory device 108 can be disposed on, or physically supported by, a printed circuit board (e.g., a rigid or flexible motherboard). The host device 104 and the memory device 108 may additionally be integrated together on an integrated circuit or fabricated on separate integrated circuits and packaged together. The memory device 108 may also be coupled to multiple host devices 104 via one or more interconnects 106 and may respond to memory requests from two or more host devices 104. Each host device 104 may include a respective memory controller 114, or the multiple host devices 104 may share a memory controller 114. This document describes with reference to FIG. 1 an example computing system architecture having at least one host device 104 coupled to a memory device 108.

Two or more memory components (e.g., modules, dies, banks, or bank groups) can share the electrical paths or couplings of the interconnect 106. The interconnect 106 can include at least one command-and-address bus (CA bus) and at least one data bus (DQ bus). The command-and-address bus can transmit addresses and commands from the memory controller 114 of the host device 104 to the memory device 108, which may exclude propagation of data. The data bus can propagate data between the memory controller 114 and the memory device 108. The memory device 108 may also be implemented as any suitable memory including, but not limited to, DRAM, SDRAM, three-dimensional (3D) stacked DRAM, DDR memory, or LPDDR memory (e.g., LPDDR DRAM or LPDDR SDRAM).

The memory device 108 can form at least part of the main memory of the apparatus 102. The memory device 108 may, however, form at least part of a cache memory, a storage memory, or a system-on-chip of the apparatus 102. The memory device 108 includes two or more banks 118-1 to 118-N and bank-shared usage-based disturbance (UBD) circuitry 120 (bank-shared UBD circuitry 120). The variable N represents a positive integer. Memory cells within each bank 118-1 to 118-N can be subjected to usage-based disturbance, including usage-based disturbance generated by unintentional or intentional activation of rows within the bank 118-1 to 118-N.

The bank-shared usage-based disturbance circuitry 120 is coupled to the banks 118-1 to 118-N and mitigates usage-based disturbance within the multiple banks 118-1 to 118-N. The bank-shared usage-based disturbance circuitry 120 selectively reads data associated with usage-based disturbance from the banks 118-1 to 118-N during different time intervals. To mitigate usage-based disturbance, the bank-shared usage-based disturbance circuitry can selectively cause one or more rows to be refreshed within any of the banks 118-1 to 118-N. The bank-shared usage-based disturbance circuitry 120 can be implemented using software, firmware, hardware, fixed logic circuitry, or combinations thereof.

In one aspect, the bank-shared usage-based disturbance circuitry 120 monitors (e.g., tracks or detects) conditions associated with usage-based disturbance within at least two banks 118. For example, the bank-shared usage-based disturbance circuitry 120 can determine how many times and/or how often one or more rows of a bank 118 are activated. In some instances, the bank-shared usage-based disturbance circuitry 120 can cause one or more rows within the bank 118 to be refreshed based on an activation count of a row exceeding a threshold. In another aspect, the bank-shared usage-based disturbance circuitry 120 can detect and/or correct bit errors, which may have been caused by usage-based disturbance. The memory device 108 is further described with respect to FIG. 2.

Figure 2:
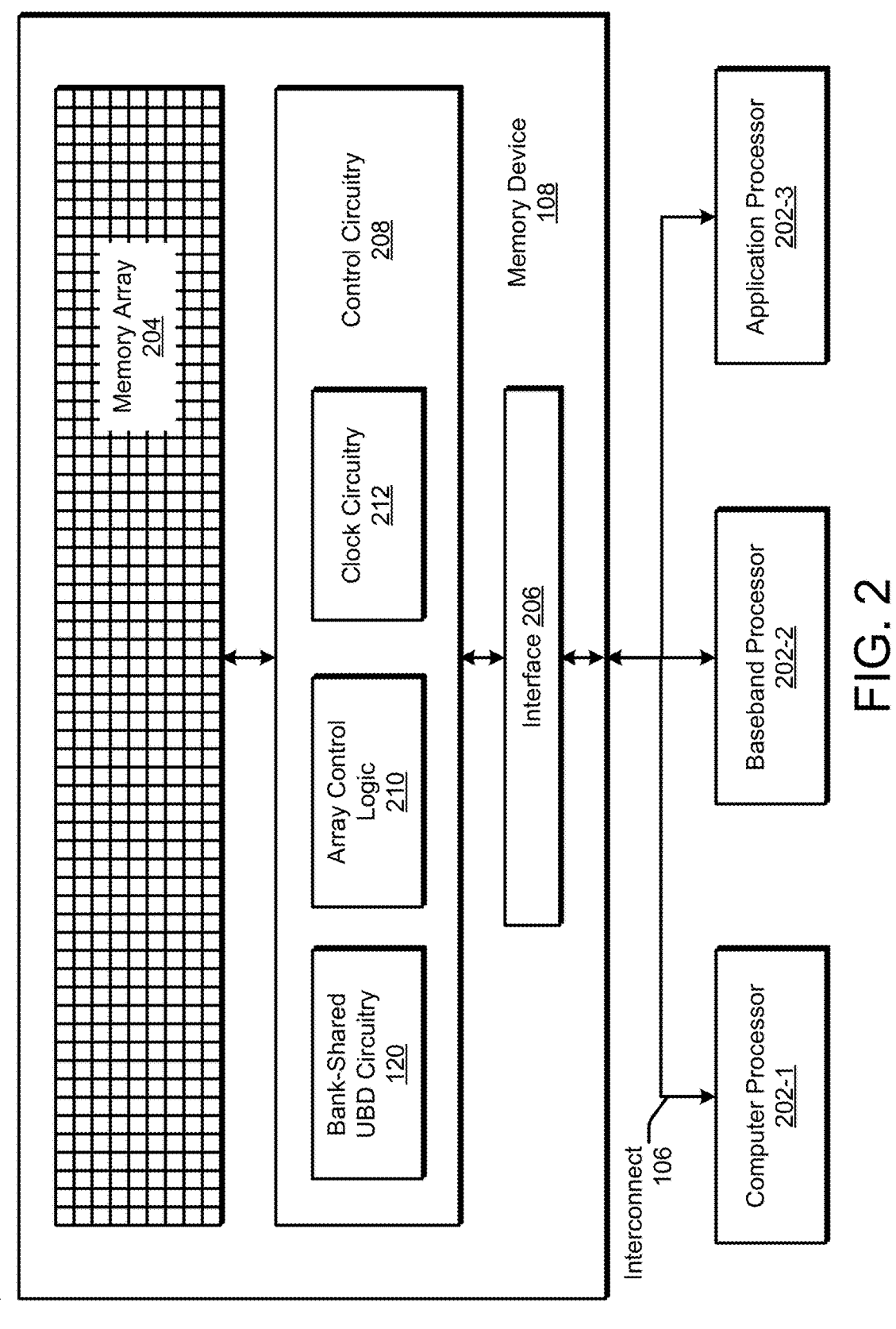
FIG. 2 illustrates an example computing system that can implement aspects of bank-shared usage-based disturbance circuitry.

FIG. 2 illustrates an example computing system 200 that can implement aspects of the apparatus 102 which includes the bank-shared usage-based disturbance circuitry 120. In some implementations, the computing system 200 includes at least one memory device 108, at least one interconnect 106, and at least one processor 202. The memory device 108 can include, or be associated with, at least one memory array 204, at least one interface 206, and control circuitry 208 (or periphery circuitry) operatively coupled to the memory array 204. The memory array 204 can include an array of memory cells, including but not limited to memory cells of DRAM, SRAM, 3D-stacked DRAM, DDR memory, low-power DRAM, or LPDDR SDRAM. The density of the memory device 108 can range, for example, from 2 Gb to 32 Gb. Although illustrated as a single memory array 204 in FIG. 2, the memory array 204 of FIG. 2 can represent multiple memory arrays 204 that are respectively associated with the multiple banks 118-1 to 118-N, as further described with respect to FIG. 4.

The memory array 204 and the control circuitry 208 may be components on a single semiconductor die or on separate semiconductor dies. The memory array 204 or the control circuitry 208 may also be distributed across multiple dies. This control circuitry 208 may manage traffic on a bus that is separate from the interconnect 106.

The control circuitry 208 can include various components that the memory device 108 can use to perform various operations. These operations can include communicating with other devices, managing memory performance, performing refresh operations (e.g., self-refresh operations or auto-refresh operations), and performing memory read or write operations. For example, the control circuitry 208 can include at least one instance of array control logic 210, clock circuitry 212, and the bank-shared usage-based disturbance circuitry 120. The array control logic 210 can include circuitry that provides command decoding, address decoding, input/output functions, amplification circuitry, power supply management, power control modes, and other functions. The clock circuitry 212 can synchronize various memory components with one or more external clock signals provided over the interconnect 106, including a command-and-address clock or a data clock. The clock circuitry 212 can also use an internal clock signal to synchronize memory components and may provide timer functionality.

The interface 206 can couple the control circuitry 208 or the memory array 204 directly or indirectly to the interconnect 106. In some implementations, the usage-based disturbance circuitry 120, the array control logic 210, and the clock circuitry 212 can be part of a single component (e.g., the control circuitry 208). In other implementations, one or more of the bank-shared usage-based disturbance circuitry 120, the array control logic 210, or the clock circuitry 212 may be implemented as separate components, which can be provided on a single semiconductor die or disposed across multiple semiconductor dies. These components may individually or jointly couple to the interconnect 106 via the interface 206.

The interconnect 106 may use one or more of a variety of interconnects that communicatively couple together various components and enable commands, addresses, or other information and data to be transferred between two or more components (e.g., between the memory device 108 and the processor 202). Although the interconnect 106 is illustrated with a single line in FIG. 2, the interconnect 106 may include at least one bus, at least one switching fabric, one or more wires or traces that carry voltage or current signals, at least one switch, one or more buffers, and so forth. Further, the interconnect 106 may be separated into at least a command-and-address bus and a data bus.

In some aspects, the memory device 108 may be a "separate" component relative to the host device 104 (of FIG. 1) or any of the processors 202. The separate components can include a printed circuit board, memory card, memory stick, and memory module (e.g., a single in-line memory module (SIMM) or dual in-line memory module (DIMM)). Thus, separate physical components may be located together within a same housing of an electronic device or may be distributed over a server rack, a data center, and so forth. Alternatively, the memory device 108 may be integrated with other physical components, including the host device 104 or the processor 202, by being combined on a printed circuit board or in a single package or a system-on-chip.

As shown in FIG. 2, the processors 202 may include a computer processor 202-1, a baseband processor 202-2, and an application processor 202-3, coupled to the memory device 108 through the interconnect 106. The processors 202 may include or form a part of a central processing unit, graphics processing unit, system-on-chip, application-specific integrated circuit, or field-programmable gate array. In some cases, a single processor can comprise multiple processing resources, each dedicated to different functions (e.g., modem management, applications, graphics, central processing). In some implementations, the baseband processor 202-2 may include or be coupled to a modem (not illustrated in FIG. 2) and be referred to as a modem processor. The modem or the baseband processor 202-2 may be coupled wirelessly to a network via, for example, cellular, Wi-Fi®, Bluetooth®, near field, or another technology or protocol for wireless communication.

In some implementations, the processors 202 may be connected directly to the memory device 108 (e.g., via the interconnect 106). In other implementations, one or more of the processors 202 may be indirectly connected to the memory device 108 (e.g., over a network connection or through one or more other devices).

Example Techniques and Hardware

Figure 3:
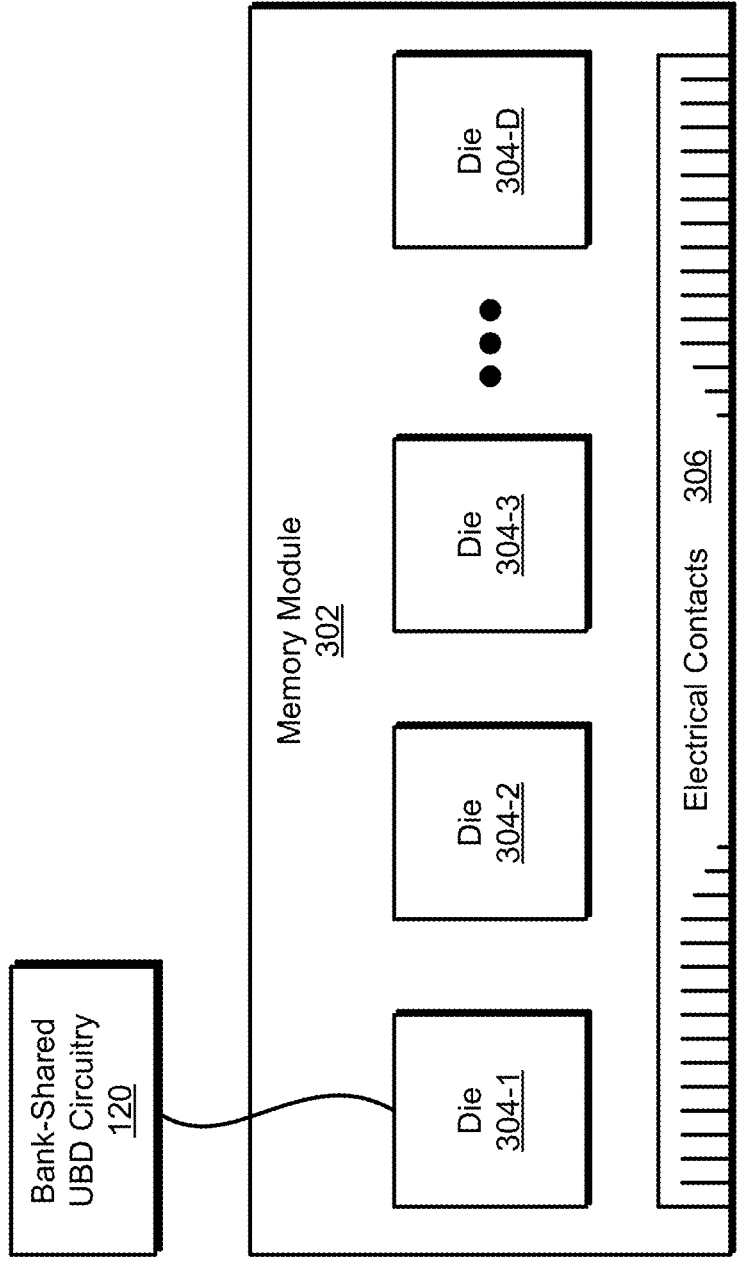
FIG. 3 illustrates an example memory device in which aspects of bank-shared usage-based disturbance circuitry can be implemented.
Figure 3:
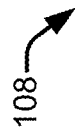

FIG. 3 illustrates an example memory device 108 in which aspects of the bank-shared usage-based disturbance circuitry 120 can be implemented. The memory device 108 includes a memory module 302, which can include multiple dies 304. As illustrated, the memory module 302 includes a first die 304-1, a second die 304-2, a third die 304-3, and a D$^{th}$ die 304-D, with D representing a positive integer. One or more of the dies 304-1 to 304-D can include multiple banks 122, including banks 122-1 to 122-N (illustrated in FIG. 1). One or more of the dies 304-1 to 304-D can include the bank-shared usage-based disturbance circuitry 120. The memory module 302 can be a SIMM or a DIMM. As another example, the memory module 302 can interface with other components via a bus interconnect (e.g., a Peripheral Component Interconnect Express (PCIe®) bus). The memory device 108 illustrated in FIGS. 1 and 2 can correspond, for example, to multiple dies (or dice) 304-1 through 304-D, or a memory module 302 with two or more dies 304. As shown, the memory module 302 can include one or more electrical contacts 306 (e.g., pins) to interface the memory module 302 to other components.

The memory module 302 can be implemented in various manners. For example, the memory module 302 may include a printed circuit board, and the multiple dies 304-1 through 304-D may be mounted or otherwise attached to the printed circuit board. The dies 304 (e.g., memory dies) may be arranged in a line or along two or more dimensions (e.g., forming a grid or array). The dies 304 may have a similar size or may have different sizes. Each die 304 may be similar to another die 304 or different in size, shape, data capacity, or control circuitries. The dies 304 may also be positioned on a single side or on multiple sides of the memory module 302. Example components of the bank-shared usage-based disturbance circuitry 120 are further described with respect to FIG. 4.

Figure 4:
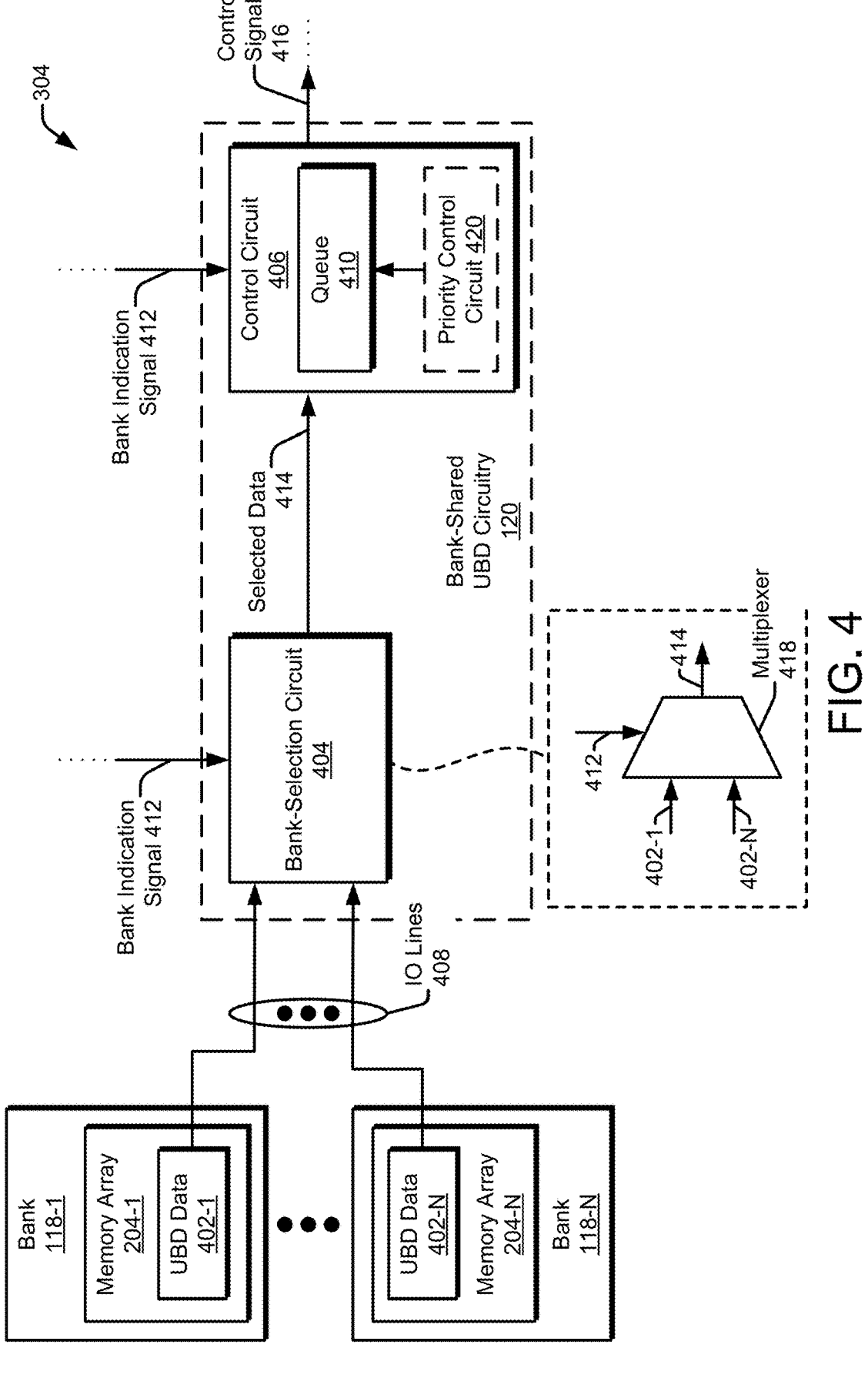
FIG. 4 illustrates example bank-shared usage-based disturbance circuitry coupled to multiple banks.

FIG. 4 illustrates an example die 304 in which aspects of the bank-shared usage-based disturbance circuitry 120 can be implemented. The die 304 can represent any of the dies 304-1 to 304-D in FIG. 3. In the depicted configuration, the die 304 includes multiple banks 118-1 to 118-N. Each bank 118 is associated with a memory array 204. For example, bank 118-1 includes a memory array 204-1, and bank 118-N includes a memory array 204-N.

Each memory array 204-1 to 204-N can store information associated with usage-based disturbance mitigation. This information is referred to as usage-based disturbance data 402 (UBD data 402). For example, the memory array 204-1 associated with the bank 118-1 stores usage-based disturbance data 402-1. Also, the memory array 204-N associated with the bank 118-N stores usage-based disturbance data 402-N. More specifically, a subset of memory cells within the memory arrays 204-1 and 204-N store the usage-based disturbance data 402. The usage-based disturbance data 402 can include information that represents a quantity of activations (e.g., an activation count or activate count) since a last refresh for one or more rows within the memory array 204. In some implementations, the usage-based disturbance data 402 includes a quantity of activation since a last refresh for each row within the memory array 204. The usage-based disturbance data 402 can also include parity bits.

The die 304 also includes the bank-shared usage-based disturbance circuitry 120. The bank-shared usage-based disturbance circuitry 120 is coupled to the banks 118-1 to 118-N. Although FIG. 4 explicitly shows the bank-shared usage-based disturbance circuitry 120 coupled to two banks 118 (e.g., banks 118-1 and 118-N), other implementations are also possible. For example, the bank-shared usage-based disturbance circuitry 120 can be coupled to more than two banks 122 (e.g., three or four banks 118).

In this example, the banks 118-1 to 118-N are part of a bank group. If the die 304 includes multiple bank groups, the die 304 can also include multiple instances of the bank-shared usage-based disturbance circuitry 120 coupled to the multiple banks associated with a corresponding bank group. In general, the die 304 includes a larger quantity of banks 118 relative to instances of the usage-based disturbance circuitry 120. In an example implementation, the die 304 includes twice as many banks 118 as instances of bank-shared usage-based disturbance circuitry 120.

The bank-shared usage-based disturbance circuitry 120 includes at least one bank-selection circuit 404 and at least one control circuit 406. The bank-selection circuit 404 is coupled to the banks 118-1 to 118-N and the control circuit 406. More specifically, the bank-selection circuit 404 is coupled, via input/output (IO) lines (IO lines 408), to the subset of memory cells of the memory arrays 204-1 to 204-N that store the usage-based disturbance data 402-1 to 402-N. Although not explicitly shown, the die 304 can include one or more arrays of sense amplifiers that are coupled between the subset of memory cells of the memory arrays 204-1 to 204-N and the bank-selection circuit 404.

The bank-selection circuit 404 selectively couples the control circuit 406 to one of the banks 118 that is associated with a current memory operation (e.g., a read operation or a write operation). This enables the usage-based disturbance data 402 to pass from the selected bank 118 to the control circuit 406. In one example, the bank-selection circuit 404 is implemented using a multiplexer 418, as shown in FIG. 4. In another example, the bank-selection circuit 404 is implemented using a switching circuit that includes one or more switches (not shown in FIG. 4).

The control circuit 406 is coupled to the control circuitry 208 and mitigates usage-based disturbance within the banks 118-1 to 118-N. In particular, the control circuit 406 can detect conditions associated with usage-based disturbance by analyzing the usage-based disturbance data 402-1 to 402-N. The control circuit 406 can also update the usage-based disturbance data 402-1 to 402-N stored in the banks 118-1 to 118-N to keep track of the activation of different rows as the memory device 108 performs various memory operations over time. Additionally, the control circuit 406 can cause one or more rows within the memory arrays 204-1 to 204-N to be refreshed if a condition associated with usage-based disturbance is detected.

The control circuit 406 includes at least one queue 410, which keeps track of rows within the memory arrays 204-1 to 204-N that are associated with a usage-based disturbance condition and are to be refreshed. The queue 410 can be implemented in various manners to support mitigating usage-based disturbance across the multiple banks 118-1 to 118-N. Example implementations of the queue 410 are further described with respect to FIGS. 5 and 6. The control circuit 406 can also include other components not shown in FIG. 4, such as a comparator, a victim row calculator, a bounded refresh configuration control circuit, and so forth.

During a memory operation, such as a read or write operation, the bank-shared usage-based disturbance circuitry 120 monitors for usage-based disturbance. Consider an example in which the memory operation is associated with the bank 118-1. In this example, the memory device 108 receives a command from the memory controller 114 as part of the memory operation. The command is associated with the bank 118-1. As part of the memory operation, the memory device 108 activates one of the rows within the memory array 204-1 of the bank 118-1. The memory device 108 also reads the usage-based disturbance data 402-1 that is associated with the activated row. Additionally, the memory device 108 generates a bank indication signal 412, which is provided to the bank-shared usage-based disturbance circuitry 120. The bank indication signal 412 indicates which bank 118 is associated with the current memory operation. In this example, the bank indication signal 412 indicates that the bank 118-1 is associated with the current memory operation.

In some example implementations, the bank indication signal 412 is generated by the control circuitry 208 based on a command that is received by the memory device 108 from the memory controller 114 as part of the memory operation. In another example implementation, the bank indication signal 412 represents a portion of the usage-based disturbance data 402 that identifies the corresponding bank 118. In this case, the bank indication signal 412 may indicate a state of the memory cell. A logic "1" state of the memory cell, for instance, may identify the bank 118-1, and a logic "0" state of the bank indication signal may identify the bank 118-N.

In accordance with the bank indication signal 412, the bank-selection circuit 404 couples the control circuit 406 to the memory array 204-1 of the bank 118-1. This enables the usage-based disturbance data 402-1 associated with the bank 118-1 to pass from the memory array 204-1 to the control circuit 406 as selected data 414. In some aspects, the selected data 414 includes an activation count associated with a row that is activated as part of the memory operation.

The control circuit 406 analyzes the selected data 414 to detect a condition associated with usage-based disturbance. For example, the control circuit 406 can compare an activation count within the selected data 414 to a threshold. If the activation count exceeds the threshold, the control circuit 406 detects the condition associated with usage-based disturbance. Otherwise, the control circuit 406 does not detect a condition associated with usage-based disturbance.

In FIG. 4, the control circuit 206 includes at least one queue 410 and optionally includes at least one priority control circuit 420. If the control circuit 406 detects the condition, the control circuit 406 populates the queue 410 with an address of the row associated with the detected condition. This row can be referred to as an aggressor row.

The queue 410 also includes information that associates the row with the bank 118-1 based on the bank indication signal 412. The control circuit 406 generates a control signal 416, which causes the memory device 108 to refresh one or more rows within the bank 118-1 to mitigate usage-based disturbance. These rows can be referred to as victim rows and represent rows that are proximate to, and in some instances adjacent to, the aggressor row. For example, an $R^{th}$ row of the bank 118-1 can represent an aggressor row, and rows $R+1$, $R+2$, $R-1$, and/or $R-2$ can represent victim rows. The control circuitry 208 (illustrated in FIG. 2) can refresh the victim rows based on the control signal 416.

In example implementations, entries in the queue 410 are processed in a first-in first-out (FIFO) order or a priority-based order. For the priority-based order, the priority control circuit 420 can provide priority information to the queue 410 so that the aggressor row is associated with a particular priority. In some cases, the priority information can be based on the activation count associated with the aggressor row.

A similar process can be performed for a subsequent memory operation that is associated with one of the other banks 118, such as bank 118-N. For example, the selected data 414 can represent the usage-based disturbance data 402-N, and the control signal 416 can cause one or more rows within the bank 118-N to be refreshed. The queue 410 is further described with respect to FIGS. 5 and 6.

Figure 5:
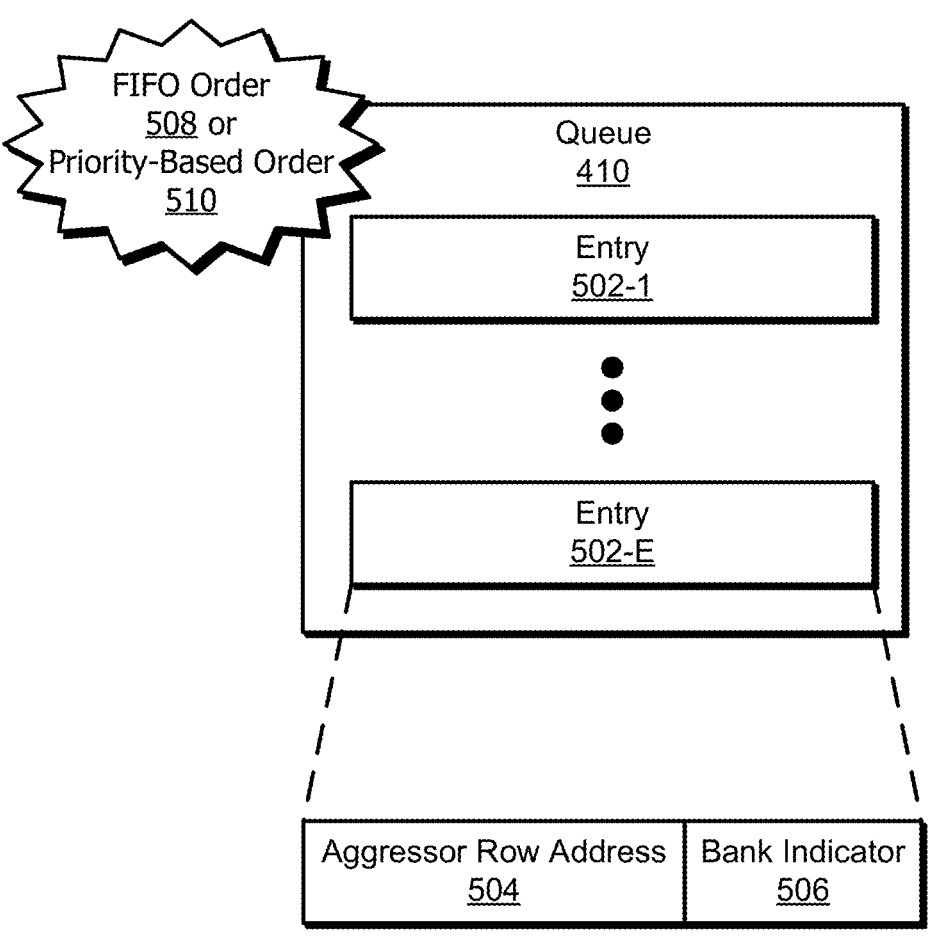
FIG. 5 illustrates an example implementation of a queue as part of bank-shared usage-based disturbance circuitry.

FIG. 5 illustrates a first example implementation of the queue 410 in which the queue 410 stores information associated with the multiple banks 118-1 to 118-N. The queue 410 can be implemented using a plurality of registers. As memory operations are performed, the control circuit 406 can populate the queue 410 with one or more entries 502-1 to 502-E, where E represents a positive integer. Each entry 502 represents an instance in which the control circuit 406 detects a condition associated with usage-based disturbance. In this example, the detected condition can correspond to any of the banks 118-1 to 118-N.

Each entry 502 includes an aggressor row address 504 and a bank indicator 506. The aggressor row address 504 indicates a row associated with the detected condition (e.g., a row with an activation count that exceeds a threshold). The bank indicator 506 represents a bank 118 that is associated with the row. For example, if the control circuit 406 detects the condition within the bank 118-1, the bank indicator 506 represents the bank 118-1. As another example, if the control circuit 406 detects the condition within the bank 118-N, the bank indicator 506 represents the bank 118-N.

Generally, the bank indicator 506 includes one or more bits that can be used to identify any of the banks 118-1 to 118-N. If the bank-shared usage-based disturbance circuitry 120 is coupled to two banks 118, the bank indicator 506 can be represented using a single bit. If the bank-shared usage-based disturbance circuitry 120 is coupled to four banks 118, the bank indicator 506 can be represented using two bits.

In an example implementation, the queue 410 processes entries 502 in a first-in first-out (FIFO) order 508 (FIFO order 508). In another example implementation, the queue 410 processes entries 502 in a priority-based order 510. Other orders are also possible, including a last-in first-out (LIFO) order or a random order.

The control circuit 406 generates a control signal 416 based on each entry 502 that is processed. As explained above, the control signal 416 can cause rows that are proximate to the aggressor row address 504 to be refreshed to mitigate usage-based disturbance. By using a single queue 410 (or fewer queues 410 than banks 118), the bank-shared usage-based disturbance circuitry 120 can save die size and power. In general, the queue 410 can be appropriately sized to handle a desired quantity of entries 502 across the multiple banks 118-1 to 118-N. In some example implementations, a depth of the queue 410 can be less than a summation of depths associated with multiple bank-specific queues, which are further described with respect to FIG. 6.

Figure 6:
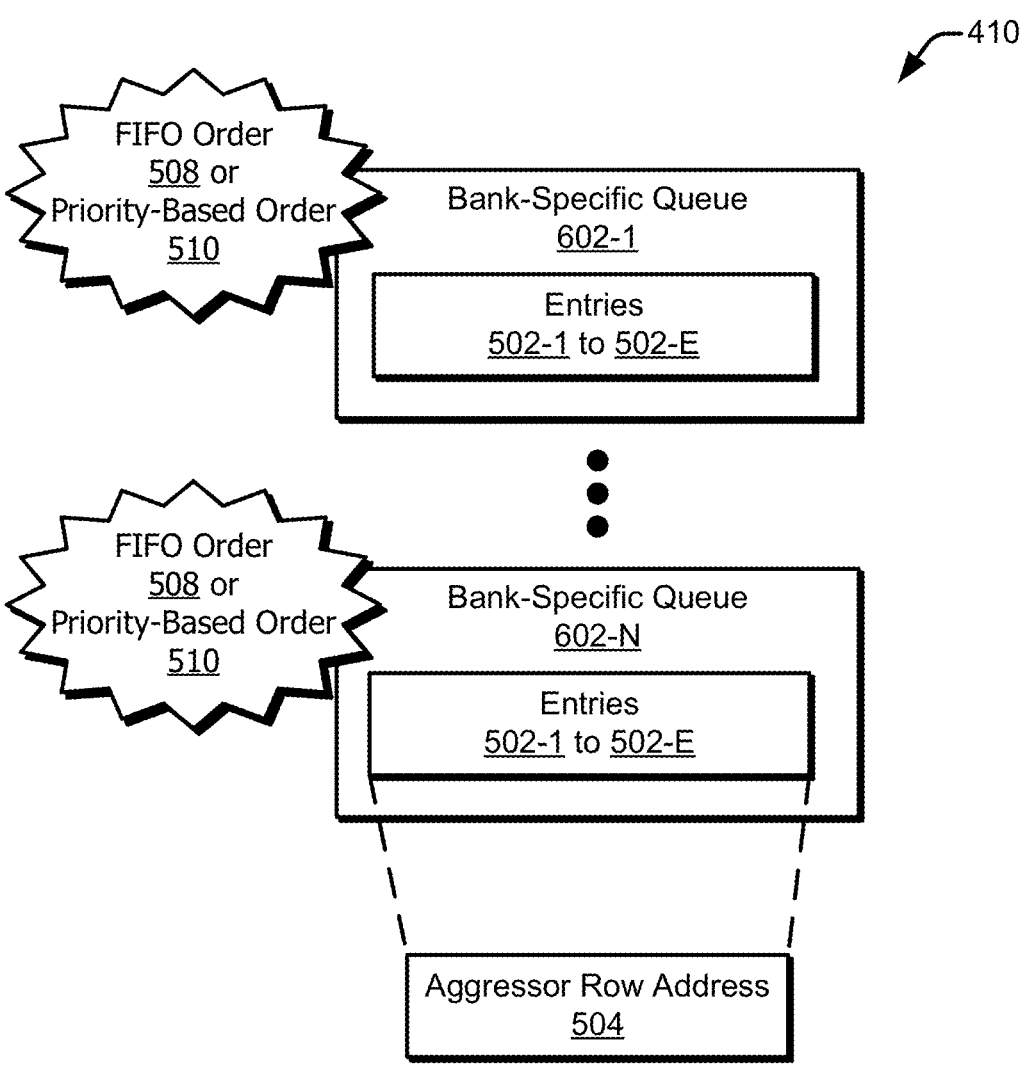
FIG. 6 illustrates another example implementation of a queue as part of bank-shared usage-based disturbance circuitry.

FIG. 6 illustrates a second example implementation of the queue 410. In this example, the queue 410 is implemented using multiple bank-specific queues 602-1 to 602-N. Each bank-specific queue 602 can be implemented using a plurality of registers. Instead of using the bank indicator 506 to associate an aggressor row address 504 with its corresponding bank 118, the aggressor row address 504 is stored in a bank-specific queue 602 that corresponds to its bank 118. As such, the entries 502-1 to 502-E within the bank-specific queue 602-1 include aggressor row addresses 504 that correspond with the bank 118-1. Likewise, the entries 502-1 to 502-E within the bank-specific queue 602-N include aggressor row addresses 504 that correspond with the bank 118-N. Each entry 502 represents an instance in which the control circuit 406 detects a condition associated with usage-based disturbance. The bank-specific queues 602-1 to 602-N can process entries 502 based on the first-in first-out (FIFO) order 508, the priority-based order 510, or another type of order.

As shown in FIG. 6, the entries 502-1 to 502-E include the aggressor row address 504 and may not include the bank indicator 506. The use of bank-specific queues 602-1 to 602-N can reduce complexity, but can have larger power consumption and a larger footprint compared to the queue 410 of FIG. 5.

In the examples described with respect to FIGS. 5 and 6, the queues 410 are implemented using a plurality of registers. Other implementations, however, are also possible in which the queues 410 are implemented using other types of hardware, software, or fixed logic circuitry.

Example Method

FIG. 7 illustrates a flow diagram for an example process that can be used to implement aspects of the bank-shared usage-based disturbance circuitry 120. At block 702, first data from a first bank is accepted by a circuit. The first data is associated with usage-based disturbance. For example, the bank-shared usage-based disturbance circuitry 120 accepts usage-based disturbance data 402-1 from a first bank 118-1, as shown in FIG. 4. The usage-based disturbance data 402-1 is associated with usage-based disturbance. Examples of usage-based disturbance data 402 include an activation count since a last refresh for one or more rows, parity bits, or some combination thereof.

In this case, the memory device 108 performs a memory operation that involves the first bank 118-1. The memory operation causes the memory device 108 to read the usage-based disturbance data 402-1 and pass the usage-based disturbance data 402-1 to the bank-shared usage-based disturbance circuitry 120. The bank-selection circuit 404 of the bank-shared usage-based disturbance circuitry 120 passes the usage-based disturbance data 402-1 to the control circuit 406 of the bank-shared usage-based disturbance circuitry 120 based on a bank indication signal 412, as shown in FIG. 4.

At block 704, a first control signal that causes at least one row within the first bank to be refreshed is generated by the circuit based on the first data. For example, the bank-shared usage-based disturbance circuitry 120 generates a first control signal 416, which causes one or more rows within first bank 118-1 to be refreshed. These rows can be referred to as victim rows. The control circuit 406 can generate the first control signal 416 if it detects a condition associated with usage-based disturbance based on the usage-based disturbance data 402-1.

At block 706, second data from a second bank is accepted by a circuit. The second data is associated with the usage-based disturbance. For example, the bank-shared usage-based disturbance circuitry 120 accepts usage-based disturbance data 402-2 from a second bank 118-2, as shown in FIG. 4. The usage-based disturbance data 402-2 is associated with the usage-based disturbance.

In this case, the memory device 108 performs another memory operation that involves the second bank 118-2. The memory operation causes the memory device 108 to read the usage-based disturbance data 402-2 and pass the usage-based disturbance data 402-2 to the bank-shared usage-based disturbance circuitry 120. The bank-selection circuit 404 passes the usage-based disturbance data 402-2 to the control circuit 406 based on the bank indication signal 412, as shown in FIG. 4.

At block 708, a second control signal that causes at least one row within the second bank to be refreshed is generated by the circuit based on the second data. For example, the bank-shared usage-based disturbance circuitry 120 generates a second control signal 416, which causes one or more rows within the second bank 118-2 to be refreshed. These rows can be referred to as victim rows. The control circuit 406 can generate the second control signal 416 if it detects a condition associated with usage-based disturbance based on the usage-based disturbance data 402-2.

For the figures described above, the orders in which operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of these methods may be implemented in, for example, hardware (e.g., fixed-logic circuitry or a processor in conjunction with a memory), firmware, software, or some combination thereof. The methods may be realized using one or more of the apparatuses or components shown in FIGS. 1 to 6, the components of which may be further divided, combined, rearranged, and so on. The devices and components of these figures generally represent hardware, such as electronic devices, packaged modules, IC chips, or circuits; firmware or the actions thereof; software; or a combination thereof. Thus, these figures illustrate some of the many possible systems or apparatuses capable of implementing the described methods.

Computer-readable media includes both non-transitory computer storage media and communication media including any medium that facilitates transfer of a computer program (e.g., an application) or data from one entity to another. Non-transitory computer storage media can be any available medium accessible by a computer, such as RAM, ROM, Flash, EEPROM, optical media, and magnetic media.

In the following, various examples for implementing aspect of the usage-based disturbance circuitry are described:

Example 1: An apparatus comprising:
    a memory device comprising:
        at least two banks configured to store data associated with usage-based disturbance; and
        a circuit coupled to the at least two banks and configured to:

accept the data from a first bank of the at least two banks; and detect, based on the data, a condition associated with the usage-based disturbance.

Example 2: The apparatus of example 1 or any other example, wherein:

the memory device is configured to receive a command;

the first bank is associated with the command; and the circuit is configured to accept the data based on the command.

Example 3: The apparatus of example 1 or any other example, wherein the circuit is configured to generate a control signal to cause at least one row of the first bank to be refreshed based on the detected condition.

Example 4: The apparatus of example 1 or any other example, wherein:

the circuit is configured to accept the data from a second bank of the at least two banks;

detect, based on the data, another condition associated with the usage-based disturbance; and generate another control signal to cause at least one row of the second bank to be refreshed based on the detected other condition.

Example 5: The apparatus of example 1 or any other example, wherein:

each bank of the at least two banks comprises a memory array;

each memory array comprises multiple memory cells;

the multiple memory cells comprise a subset of cells configured to store the data associated with the usage-based disturbance; and the circuit comprises at least one selection circuit coupled to the subset of cells of the at least two banks.

Example 6: The apparatus of example 5 or any other example, wherein the selection circuit is configured to:

receive a bank indication signal that indicates a bank of the at least two banks that is associated with a current memory operation; and pass the data that is stored by the subset of cells associated with the memory array of the bank based on the bank indication signal.

Example 7: The apparatus of example 1 or any other example, wherein the circuit comprises a queue configured to:

store a row address associated with the detected condition; and store a bank indicator associated with the first bank.

Example 8: The apparatus of example 7 or any other example, wherein the queue comprises a plurality of registers configured to process entries in a first-in first-out (FIFO) order.

Example 9: The apparatus of example 1 or any other example, wherein the circuit comprises multiple queues configured to store a row address associated with the detected condition for corresponding banks of the at least two banks.

Example 10: The apparatus of example 9 or any other example, wherein the multiple queues comprise:

a first queue configured to store the row address associated with the detected condition for the first bank of the at least two banks; and a second queue configured to store the row address associated with another detected condition for a second bank of the at least two banks.

Example 11: An apparatus comprising:

a memory device comprising:

multiple banks, each bank comprising a memory array, the memory array comprising multiple memory cells;

input/output lines coupled to the memory cells of the multiple banks; and a circuit comprising a selection circuit coupled to a subset of the input/output lines associated with each of the multiple banks.

Example 12: The apparatus of example 11 or any other example, wherein the circuit comprises at least one queue coupled to the selection circuit and configured to store information associated with mitigating usage-based disturbance across at least two banks of the multiple banks.

Example 13: The apparatus of example 12 or any other example, wherein the at least one queue comprises:

a single queue configured to store the information associated with the multiple banks; or multiple queues respectively configured to store the information associated with the multiple banks.

Example 14: The apparatus of example 11 or any other example, wherein:

the circuit comprises a control circuit coupled to the selection circuit; and the selection circuit is configured to selectively couple the subset of the input/output lines associated with each bank of the multiple banks to the control circuit.

Example 15: The apparatus of example 14 or any other example, wherein the subset of the input/output lines are coupled to a subset of the memory cells that is configured to store data associated with usage-based disturbance.

Example 16: The apparatus of example 15 or any other example, wherein the data comprises activation counts associated with each row of the memory array.

Example 17: The apparatus of example 15 or any other example, wherein:

the memory device is configured to perform, during different time intervals, at least two memory operations respectively associated with at least two banks of the multiple banks;

the selection circuit is configured to pass, to the control circuit and as part of the at least two memory operations, the data associated with the at least two banks during the different time intervals; and the control circuit is configured to generate at least two control signals, based on the data, to cause the memory device to refresh at least one row within the at least two banks to mitigate usage-based disturbance.

Example 18: A method comprising:

accepting, by a circuit, first data from a first bank, the first data associated with usage-based disturbance;

generating, by the circuit and based on the first data, a first control signal that causes at least one row within the first bank to be refreshed;

accepting, by the circuit, second data from a second bank, the second data associated with the usage-based disturbance; and generating, by the circuit and based on the second data, a second control signal that causes at least one row within the second bank to be refreshed.

Example 19: The method of example 18 or any other example, further comprising:

performing, by a memory device that includes the circuit, two memory operations respectively associated with the first and second banks during different time intervals; and reading, by the memory device, the first and second data associated with the usage-based disturbance during the different time intervals.

Example 20: The method of example 18 or any other example, further comprising storing, by the circuit, information associated with mitigating the usage-based disturbance in the first and second bank within at least one queue.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although aspects of implementing bank-shared usage-based disturbance circuitry have been described in language specific to certain features and/or methods, the subject of the appended claims is not necessarily limited to the specific features or methods described. Rather, the specific features and methods are disclosed as a variety of example implementations of bank-shared usage-based disturbance circuitry.

What is claimed is:

1. An apparatus comprising:
   a memory device comprising:
      at least two banks configured to store data that can be referenced to support usage-based disturbance mitigation; and
   a circuit coupled to the at least two banks and configured to:
      accept the data from a first bank of the at least two banks;
      detect, based on the data, a condition associated with usage-based disturbance; and
      initiate the usage-based disturbance mitigation for the first bank based on the detection of the condition.

2. The apparatus of claim 1, wherein:
   the memory device is configured to receive a command from a memory controller;
   the first bank is associated with the command; and
   the circuit is configured to accept the data based on the command.

3. The apparatus of claim 1, wherein the circuit is configured to generate a control signal to cause at least one row of the first bank to be refreshed based on the detected condition.

4. The apparatus of claim 1, wherein:
   the circuit is configured to accept the data from a second bank of the at least two banks;
   detect, based on the data, another condition associated with the usage-based disturbance; and
   generate another control signal to cause at least one row of the second bank to be refreshed based on the detected other condition.

5. The apparatus of claim 1, wherein:
   each bank of the at least two banks comprises a memory array;
   each memory array comprises multiple memory cells;
   the multiple memory cells comprise a subset of cells configured to store the data; and
   the circuit comprises at least one selection circuit coupled to the subset of cells of the at least two banks.

6. The apparatus of claim 5, wherein the selection circuit is configured to:
   receive a bank indication signal that indicates a bank of the at least two banks that is associated with a current memory operation; and
   pass the data that is stored by the subset of cells associated with the memory array of the bank based on the bank indication signal.

7. The apparatus of claim 1, wherein the circuit comprises a queue configured to:
   store a row address associated with the detected condition; and
   store a bank indicator associated with the first bank.

8. The apparatus of claim 7, wherein the queue comprises a plurality of registers configured to process entries in a first-in first-out (FIFO) order.

9. The apparatus of claim 1, wherein the circuit comprises multiple queues configured to store a row address associated with the detected condition for corresponding banks of the at least two banks.

10. The apparatus of claim 9, wherein the multiple queues comprise:
   a first queue configured to store the row address associated with the detected condition for the first bank of the at least two banks; and
   a second queue configured to store the row address associated with another detected condition for a second bank of the at least two banks.

11. An apparatus comprising:
   a memory device comprising:
      multiple banks, each bank comprising a memory array, the memory array comprising multiple memory cells, a subset of the multiple memory cells configured to store data that can be referenced to support usage-based disturbance mitigation;
      input/output lines coupled to the memory cells of the multiple banks; and
      a circuit comprising a selection circuit coupled to a subset of the input/output lines associated with each bank of the multiple banks, the subset of the input/output lines being coupled to the subset of the multiple memory cells associated with each bank of the multiple banks.

12. The apparatus of claim 11, wherein the circuit comprises at least one queue coupled to the selection circuit and configured to store information associated with mitigating usage-based disturbance across at least two banks of the multiple banks.

13. The apparatus of claim 12, wherein the at least one queue comprises:
   a single queue configured to store the information associated with the multiple banks; or
   multiple queues respectively configured to store the information associated with the multiple banks.

14. The apparatus of claim 12, wherein the information associated with mitigating usage-based disturbance across the at least two banks comprises:

at least one row address of the at least two banks; and at least one bank indicator that identifies one of the at least two banks that is associated with the at least one row address.

15. The apparatus of claim 11, wherein:

the circuit comprises a control circuit coupled to the selection circuit; and the selection circuit is configured to selectively couple the subset of the input/output lines associated with each bank of the multiple banks to the control circuit.

16. The apparatus of claim 15, wherein:

the memory device is configured to perform, during different time intervals, at least two memory operations respectively associated with at least two banks of the multiple banks;

the selection circuit is configured to pass, to the control circuit and as part of the at least two memory operations, the data associated with the at least two banks during the different time intervals; and the control circuit is configured to generate at least two control signals, based on the data, to cause the memory device to refresh at least one row within the at least two banks to mitigate usage-based disturbance.

17. The apparatus of claim 11, wherein the data comprises activation counts associated with each row of the memory array.

18. A method comprising:

accepting, by a circuit, first data from a first bank, the first data associated with usage-based disturbance;

generating, by the circuit and based on the first data, a first control signal that causes at least one row within the first bank to be refreshed;

accepting, by the circuit, second data from a second bank, the second data associated with the usage-based disturbance; and generating, by the circuit and based on the second data, a second control signal that causes at least one row within the second bank to be refreshed.

19. The method of claim 18, further comprising:

performing, by a memory device that includes the circuit, two memory operations respectively associated with the first and second banks during different time intervals; and reading, by the memory device, the first and second data associated with the usage- based disturbance during the different time intervals.

20. The method of claim 18, further comprising storing, by the circuit, information associated with mitigating the usage-based disturbance in the first and second bank within at least one queue.

* * * * *